US006958663B2

(12) United States Patent
Eihama et al.

(10) Patent No.: US 6,958,663 B2
(45) Date of Patent: Oct. 25, 2005

(54) IN-BAND GROUP DELAY EQUALIZER AND DISTORTION COMPENSATION AMPLIFIER

(75) Inventors: Toru Eihama, Matto (JP); Makoto Matsudaira, Kanazawa (JP); Yasuo Yamada, Kanazawa (JP)

(73) Assignee: Murata Manufacturing Co., Ltd. (JP)

( * ) Notice: Subject to any disclaimer, the term of this patent is extended or adjusted under 35 U.S.C. 154(b) by 60 days.

(21) Appl. No.: 10/382,854

(22) Filed: Mar. 7, 2003

(65) Prior Publication Data

US 2003/0169123 A1 Sep. 11, 2003

(30) Foreign Application Priority Data

Mar. 7, 2002 (JP) .......................................... 2002-062162

(51) Int. Cl.[7] .............................. H01P 9/00; H04B 3/04
(52) U.S. Cl. .................... 333/156; 333/28 R; 333/164; 330/151
(58) Field of Search ............................... 333/28 R, 117, 333/156, 161, 164, 151; 330/151, 149

(56) References Cited

U.S. PATENT DOCUMENTS

| | | | | |
|---|---|---|---|---|
| 3,277,403 A | | 10/1966 | Cohn | |
| 3,967,220 A | * | 6/1976 | Tagashira et al. | ......... 333/28 R |
| 4,197,514 A | | 4/1980 | Kasuga et al. | |
| 4,595,882 A | * | 6/1986 | Silagi et al. | ................ 330/151 |
| 4,818,959 A | * | 4/1989 | Katoh | ...................... 333/28 R |
| 5,119,050 A | * | 6/1992 | Upshur et al. | ............... 333/164 |
| 5,789,998 A | * | 8/1998 | Kim et al. | ................... 333/134 |
| 6,317,013 B1 | | 11/2001 | Hershtig | |
| 6,664,869 B2 | * | 12/2003 | Hershtig | ..................... 333/156 |
| 2002/0153971 A1 | | 10/2002 | Hershtig | |

FOREIGN PATENT DOCUMENTS

| | | |
|---|---|---|
| EP | 0 454 637 A2 | 1/1991 |
| EP | 1 071 156 A2 | 1/2001 |
| JP | 58 223901 | 12/1983 |
| JP | 2001-36304 | 2/2001 |
| JP | 2001036304 | 2/2001 |
| JP | 2001119206 | 4/2001 |
| JP | 2001-119206 | 4/2001 |
| JP | 2001257505 | 9/2001 |
| WO | WO 01/01511 A1 | 1/2001 |
| WO | WO01/01511 | 1/2001 |
| WO | WO 02/080301 | 10/2002 |

OTHER PUBLICATIONS

Korean Office Action issued Oct. 1, 2004.
Chen, M.H., "The Design of a Multiple Cavity Equalizer", IEEE Transactions on Microwave Theory and Techniques, IEEE Inc., New York, vol. 20, No. 9, (Sep. 1982), pp. 1380–1383.
European Search Report dated Feb. 18, 2004.

* cited by examiner

*Primary Examiner*—Dinh T. Le
(74) *Attorney, Agent, or Firm*—Dickstein, Shapiro, Morin & Oshinsky, LLP.

(57) ABSTRACT

An in-band group delay equalizer is formed in a simple circuit configuration so as to have a flat group delay characteristic over a wide frequency band without having a peak of group delay near each passband edge. The in-band group delay equalizer includes a plurality of convex group delay circuits. Each convex group delay circuit is formed of one hybrid coupler and two resonators connected to respective divided output ports of the hybrid coupler. The center frequencies of the respective convex group delay circuits are set to be different from each other so that the overall group delay characteristic of the in-band group delay equalizer becomes flat. The bandwidth and the group delay can be easily adjusted. A distortion compensation amplifier with very low distortion can be realized using such an in-band group delay equalizer.

6 Claims, 20 Drawing Sheets

IN-BAND GROUP DELAY EQUALIZER AND DISTORTION COMPENSATION AMPLIFIER

BACKGROUND OF THE INVENTION

1. Field of the Invention

The present invention relates to an in-band group delay equalizer and a distortion compensation amplifier for use in a high-frequency band.

2. Description of the Related Art

In the art of base stations for mobile radio communication systems, a large number of distortion compensation amplifiers are used for the purpose of reducing the size of base stations.

A known technique to realize a distortion compensation amplifier is to use a feedforward amplifier. In this technique, it is required that the group delay time of a high-power path and that of a low-power path should be equal to each other in both a distortion detection circuit and a distortion suppression circuit. To obtain equal group delay times, coaxial cables were used in the early days of the technology. In recent years, reductions in size and loss have been achieved by using delay filters instead of coaxial cables.

In delay filters used for this purpose, it is required that the group delay characteristic thereof should be flat over a passband (variation in group delay time within the passband should be small). Conventionally, the delay filter is formed of a multi-stage bandpass filter. FIGS. 14 to 16 show an example of a delay filter formed of a multistage bandpass filter. FIG. 14 shows an equivalent circuit of a delay filter including eight resonators. In FIG. 14, reference symbols Ra to Rh denote resonators. Adjacent resonators are coupled with each other via a capacitor.

FIG. 15 shows the structure of the delay filter. In FIG. 15, reference numeral 4 denotes a substrate. Coaxial resonators Ra to Rh and a coupling board 21 on which a plurality of capacitors are formed, are disposed on the upper surface of the substrate 4. The central conductor of each coaxial resonator is connected to one of electrodes formed on the coupling board 21.

FIG. 16A shows the group delay characteristic of this delay filter, and FIG. 16B shows the transfer characteristic thereof.

Japanese Unexamined Patent Application Publication No. 2001-257505 discloses a delay filter formed by adding a parallel capacitor for jump coupling to a common-type bandpass filter. An example of such a delay filter is shown in FIG. 17 to 18, wherein FIGS. 17 and 18 show an equivalent circuit and the structure thereof, respectively. In this example, the second-stage resonator Rb and the fifth-stage resonator Re are jump-coupled with each other via the parallel capacitor. In FIG. 18, reference numeral 22 denotes a coupling board for realizing the jump coupling. FIGS. 19A and 19B show the group delay characteristic and the transfer characteristic, respectively, of this delay filter.

W001/01511A1 discloses a technique of equalizing the overall group delay characteristic by adding a circuit having a convex group delay characteristic to a bandpass filter having a concave group delay characteristic. FIGS. 20A and 20B show examples of the group delay characteristic and the transfer characteristic, respectively, of the filter disclosed in W001/01511A1. In FIG. 20A, curve b indicates the concave group delay characteristic and curve c indicates the convex group delay characteristic, employed in the this filter, and the overall in-band group delay characteristic obtained by combining them is indicated by curve a. In FIG. 20B, S21 indicates the input-to-output transfer characteristic, and S11 and S22 indicate the reflection characteristics at the input port and the output port, respectively.

In those conventional techniques described above, to achieve good characteristics such as 2100 to 2170 MHz for the passband, 7.5 ns for the group delay, and 0.2 ns for the group delay variation, eight (eight-stage) dielectric resonators are needed in the case of the multi-stage bandpass filter, and six (six-stage) dielectric resonators are needed in the case of the bandpass filter disclosed in Japanese Unexamined Patent Application Publication No. 2001257505 and in the case of the group delay filter disclosed in W001/01511A1.

In any of the conventional techniques described above, the group delay has peaks near both edges of the passband, and thus it is difficult to achieve a flat characteristic in terms of the group delay over a wide band. To increase the group delay bandwidth, the number of resonators of the bandpass filter has to be increased. However, the increase in the number of resonators results in increases in outer dimension and insertion loss. Additionally, the increase in the number of resonators causes a further increase in peaks of the group delay near edges of the passband.

Furthermore, to change the group delay time of the delay filter according to any of the conventional techniques described above, the bandwidth of the bandpass filter must be changed. In general, when the bandwidth of the bandpass filter is changed, the coupling factors between resonators and the resonant frequencies of respective resonators needs to be optimized. Thus, in mass production of delay filters, difficult and time-consuming adjustment is needed.

Furthermore, the capacitance of the parallel capacitor for jump coupling is small compared with the capacitance of capacitors for coupling adjacent resonators, and thus the jump coupling is influenced significantly by stray capacitance which is not shown in the equivalent circuit illustrated in FIG. 17. As a result, produced delay filters have a large variation in characteristic.

SUMMARY OF THE INVENTION

A general object of the present invention is to solve the problems described above. More specifically, an object of the present invention is to provide an in-band group delay equalizer formed by a simple circuit and having good flatness in group delay characteristics. Another object of the present invention is to provide a distortion compensation amplifier using an in-band group delay equalizer.

According to an aspect of the present invention, there is provided an in-band group delay equalizer comprising two or more convex group delay circuits having convex group delay characteristics in which the delay time decreases with a deviation of frequency from the center frequency, wherein the center frequencies of the convex group delay circuits are set to be different from each other and the convex group delay circuits are connected in cascade.

In this in-band group delay equalizer according to the present invention, each convex group delay circuit may include a hybrid coupler and a resonant circuit connected to a divided output port of the hybrid coupler.

Furthermore, in the in-band group delay equalizer according to the present invention, the resonant circuit may be formed of a dielectric coaxial resonator.

Alternatively, the resonant circuit may be formed of a series connection of a dielectric coaxial resonator and a reactance element.

In the in-band group delay equalizer according to the present invention, the in-band group delay equalizer may include three or more convex group delay circuits, and the group delay time of a convex group delay circuit having a highest center frequency and the group delay times of a convex group delay circuit having a lowest center frequency may be set to be greater than the group delay time of the other convex group delay circuits.

According to another aspect of the present invention, there is provided a distortion compensation amplifier for making compensation for distortion by means of adjustment of group delay time produced by a group delay circuit, wherein the group delay circuit is formed of an in-band group delay equalizer based on one of the above-described techniques according to the present invention.

In this distortion compensation amplifier according to the present invention, the distortion compensation amplifier may be constructed in the form of a feedforward amplifier including a distortion detection loop and a distortion suppression loop, wherein each of the distortion detection loop and the distortion suppression loop includes a group delay circuit.

As described above, the present invention makes it possible to realize an in-band group delay equalizer having a small variation in group delay time over a wide frequency band, using a simple circuit formed by a combination of a plurality of convex group delay circuits having different center frequencies of group delay characteristics, instead of bandpass filters employed in the conventional technique.

In the in-band group delay equalizer according to the present invention, each convex group delay circuit may be formed of a hybrid coupler and resonant circuits connected to divided output ports of the hybrid coupler. This allows each convex group delay circuit to be formed using small-sized components and a small number of resonators. Thus, it is possible to realize an in-band group delay equalizer with a reduced total size at low cost.

Furthermore, in the in-band group delay equalizer according to the present invention, each resonant circuit connected to a hybrid coupler may be formed of a dielectric coaxial resonator. This allows a reduction in the total size of the in-band group delay equalizer, and also allows the resonant frequency to be adjusted easily.

Furthermore, in the in-band group delay equalizer according to the present invention, each resonant circuit connected to the hybrid coupler may be formed of a series connection of a dielectric coaxial resonator and a reactance element. This makes it possible to easily determine the resonant frequency of the resonant circuit without causing a reduction in Q value of the dielectric coaxial resonator. Thus, it is possible to adjust the frequency band while maintaining the variation in the delay time of the in-band group delay equalizer at a small level.

Furthermore, according to the present invention, the in-band group delay equalizer may include three or more convex group delay circuits, and the group delay times thereof may be set such that the group delay time of a convex group delay circuit having a highest center frequency and the group delay time of a convex group delay circuit having a lowest center frequency become greater than the group delay time of the other convex group delay circuits so that the overall group delay characteristic becomes flat over a wide frequency band.

The present invention also provides a distortion compensation amplifier using an in-band group delay equalizer constructed in the above-described manner. The distortion compensation amplifier is capable of precisely detecting distortion and suppressing the distortion to a very low level. Thus, it is possible to realize an amplifier with very low distortion.

In the distortion compensation amplifier according to the present invention, the distortion compensation amplifier may be constructed in the form of a feedforward amplifier including group delay circuits in a distortion detection loop and a distortion suppression loop. This makes it possible to suppress distortion to a further lower level using a simple circuit.

DESCRIPTION OF THE PREFERRED EMBODIMENTS

An in-band group delay equalizer (hereinafter, referred to simply as a "group delay equalizer") according to a first embodiment is described below with reference to FIGS. 1 to 5.

Figure 1:
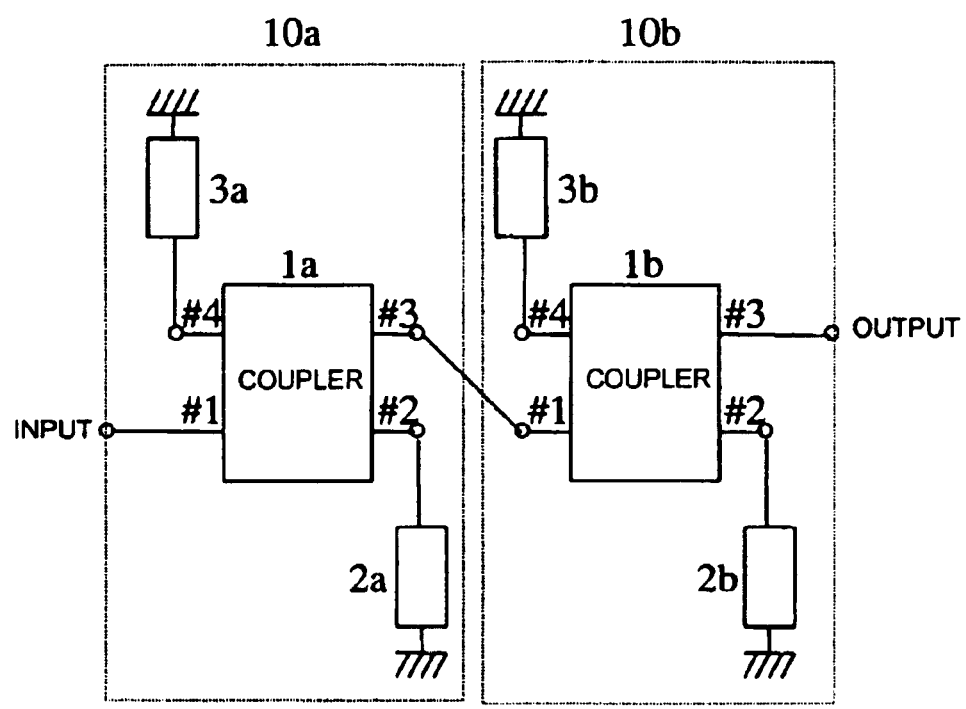
FIG. 1 is an equivalent circuit of an in-band group delay equalizer according to a first embodiment of the present invention.

FIG. 1 is a circuit diagram of the group delay equalizer. The group delay equalizer includes a resonators 2a, 2b, 3a, and 3b, and 4-port hybrid couplers (hereinafter, referred to simply as couplers) 1a and 1b. Each of the couplers 1a and 1b includes a port #1 serving as an input port, ports #2 and #4 serving as divided output port, and a port #3 serving as a termination port. The divided output ports #2 are terminated with the resonators 2a and 2b, respectively, and the divided output ports #4 are terminated with the resonators 3a and 3b, respectively. The termination port #3 of each coupler is used as an output port.

Reference numeral 10a denotes a convex group delay circuit including a coupler 1a and two resonators 2a and 3a. A signal input via an input terminal is applied to the port #1 of the coupler 1a and output from the two ports #2 and #4. The signals output from the ports #2 and #4 are returned back from the resonant circuits composed of the resonators 2a and 3a, respectively, connected to the respective ports #2 and #4, wherein the characteristics of the respective resonant circuits are reflected in the returned signals. The returned signals are respectively input to the ports #2 and #4 and output from the port #3. Thus, convex group delay characteristic is obtained, as will be described in detail later.

Similarly, reference numeral 10b denotes a convex group delay circuit, which is formed of a coupler 1b and two resonators 2b and 3b so as to have convex group delay characteristic.

The port #3 of the coupler 1a, serving as the output port of the convex group delay circuit 10a, is connected to the port #1 of the coupler 1b, serving as the input port of the convex group delay circuit 10b. The port #1 of the coupler 1a is used as the input port of the convex group delay circuit 10a, and the port #3 of the coupler 1b is used as the output port of the convex group delay circuit 10b.

That is, the two convex group delay circuits 10a and 10b are connected in cascade.

Thus, a group delay equalizer is formed of a two-stage convex group delay circuit obtained by cascading two convex group delay circuits 10a and 10b.

Figure 2:
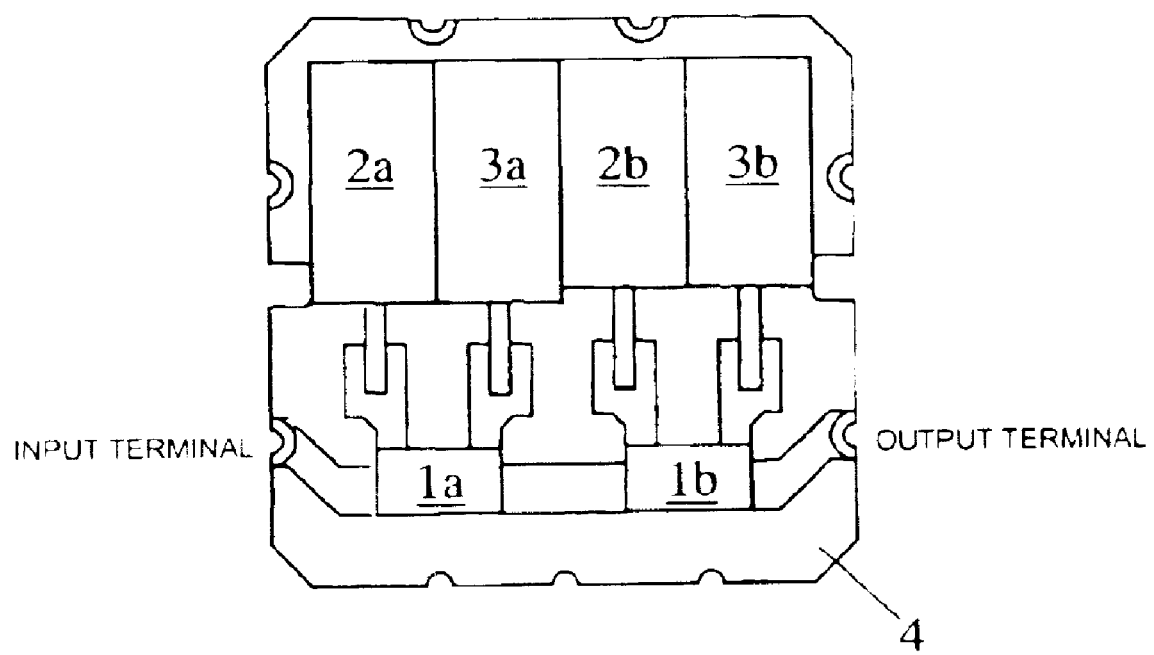
FIG. 2 is a diagram showing the structure of the in-band group delay equalizer according to the first embodiment of the present invention.

FIG. 2 shows the structure of the group delay equalizer. As shown in FIG. 2, four resonators 2a, 3a, 2b, and 3b are disposed on a substrate 4. Each of the four resonators 2a, 3a, 2b, and 3b is formed of a dielectric coaxial resonator. Each dielectric coaxial resonator preferably includes a rectangular dielectric block having a through-hole which is formed in the center thereof and the inner surface of which is covered with an inner conductor. An outer conductor is formed on the outer surface of the dielectric block. A pin electrode is inserted in the through-hole such that the pin electrode is electrically connected to the inner conductor. The outer conductor of each dielectric coaxial resonator is connected to a ground electrode formed on the substrate 4, and the pin electrode is connected to an electrode pattern formed on the upper surface of the substrate 4. The couplers 1a and 1b are disposed on the upper surface of the substrate 4 such that the couplers 1a and 1b are connected to the electrode pattern formed on the substrate 4. In this structure, the four ports #1 to #4 of the coupler 1a are connected to the input terminal, the resonators 2a and 3a, and the input port of the coupler 1b, respectively, via the electrode pattern formed on the substrate 4. On the other hand, the four ports #1 to #4 of the coupler 1b are connected to the output port of the coupler 1a, the resonators 2b and 3b, and the output terminal, respectively, via the electrode pattern formed on the substrate 4.

Figure 3:
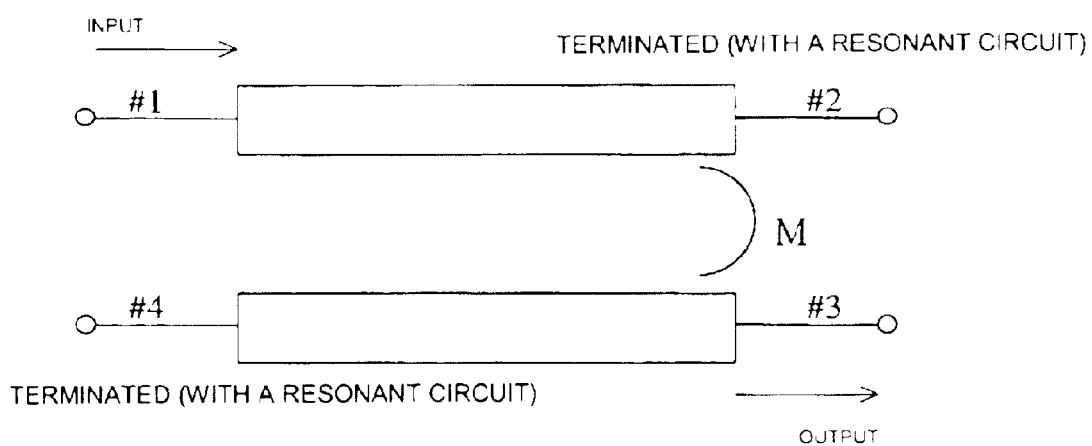
FIG. 3 is a diagram showing the structure of a coupler used in the in-band group delay equalizer according to the first embodiment of the present invention.

FIG. 3 shows the structure of the couplers described above. In this example, the coupler is constructed in the form of a hybrid coupler including two transmission lines coupled together. A signal input to the port #1 is divided into two signals having half power of the power of the input signal, and the divided signals are output from the ports #2 and #4. If the two ports #2 and #4 are resistively terminated, no output appears from the port #3. In reality, a resonator is connected to each of the ports #2 and #4 as shown in FIG. 1 so that a signal, with a group delay having a convex peak at a frequency close to the resonant frequencies of the respective resonators, is output from the port #3.

Figure 4A:
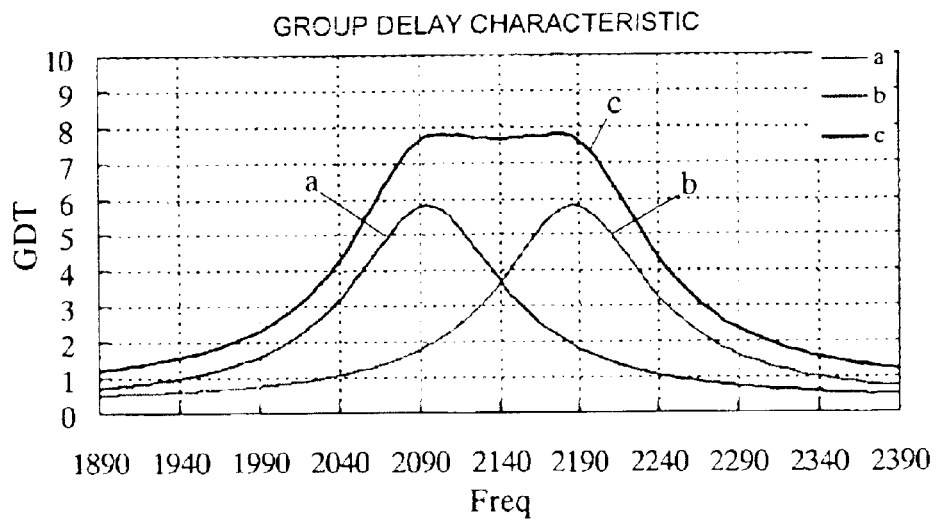
FIGS. 4A to 4C are graphs showing examples of the group delay characteristic and the transfer characteristic of the in-band group delay equalizer according to the first embodiment of the present invention.
Figure 4B:
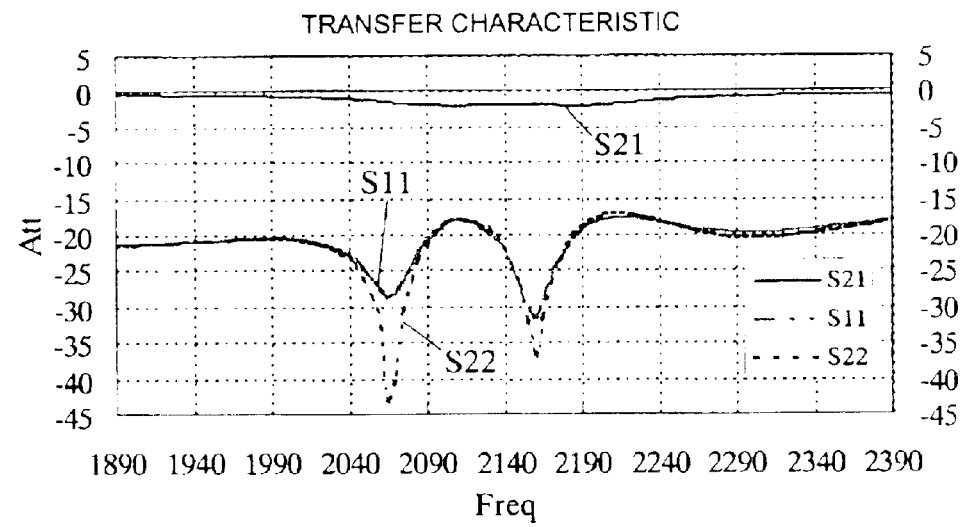
Figure 4C:
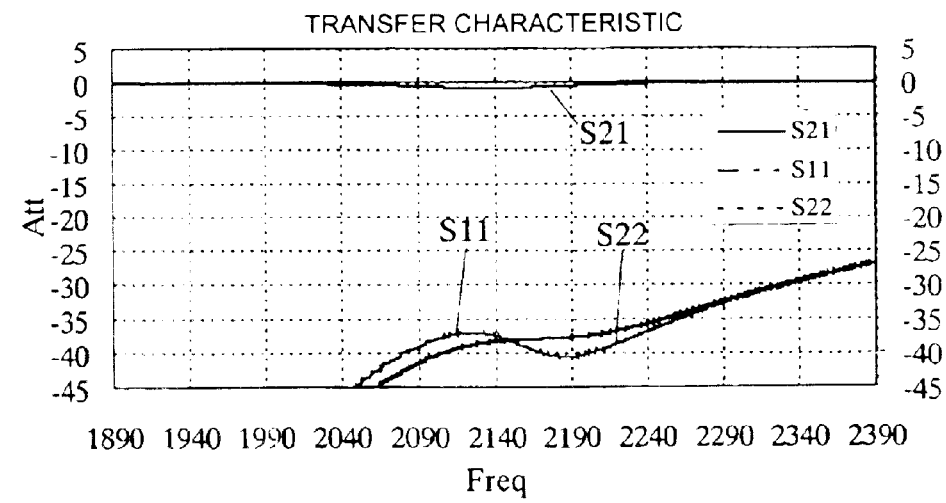

FIGS. 4A to 4C show the characteristic of the group delay equalizer described above. More specifically, FIG. 4A shows the group delay characteristic, and FIG. 4B shows the transfer characteristic of the group delay equalizer. FIG. 4C shows the transfer characteristic of one stage of the convex group delay circuit (10b). In FIGS. 4A to 4C, the horizontal axis indicates the frequency (in MHz) (in graphs in other figures, the horizontal axis also indicates the frequency (in MHz).

In FIG. 4A, curve a indicates the group delay characteristic of the convex group delay circuit 10a, and curve b indicates the group delay characteristic of the convex group delay circuit 10b. Curve c indicates the overall group delay characteristic of the whole group delay equalizer shown in FIG. 1. In FIG. 4A, the vertical axis indicates the group delay time in units of ns. In other graphs showing group delay characteristics which will be referred to later, the vertical axis also indicates the group delay time in units of ns.

In the first-stage convex group delay circuit 10a, the center frequency of the group delay characteristic is equal to 2095 MHz, and the center frequency of the group delay characteristic of the second-stage convex group delay circuit 10b is equal to about 2185 MHz. If two convex group delay circuits, which provide delay time decreasing with deviation in frequency from the respective center frequencies which are set to be different from each other, are combined, the overall group delay characteristic becomes flat over a frequency band as indicated by curve c.

In FIG. 4B, curve S21 indicates the input-to-output transfer characteristic of the group delay equalizer, and curves S11 and S22 indicate the reflection characteristics at the input port and the output port, respectively, of the group delay equalizer. In FIG. 4C, curve S21 indicates the input-to-output transfer characteristic of the convex group delay circuit, and curves S11 and S22 indicate the reflection characteristics at the input port and the output port, respectively, of the convex group delay circuit. In FIGS. 4B and 4C, the vertical axis indicates attenuation represented in dB. In other graphs showing transfer characteristics, the vertical axis also indicates attenuation represented in dB.

Using the couplers in the above-described manner makes it possible to minimize the reflection at the input and output ports over a wide frequency band. The two convex group delay circuits 10a and 10b have no attenuation in their transfer characteristics, as with coaxial transmission lines. Thus, as shown in FIG. 4B, the group delay equalizer has a flat transfer characteristic over a wide frequency band.

Although in the example shown in FIG. 3, the coupler is constructed in the form of a 3-dB distributed-coupling hybrid coupler, the coupler may be constructed in any form as long as it functions as a hybrid coupler. For example, a hybrid coupler using a bridge circuit may be employed, as will be described later. That is, any four-port coupler, in which two specific ports are coupled by a particular coupling factor and those two specific ports are isolated from the remaining ports, may be employed.

The group delay time of the convex group delay circuits (10a and 10b) can be adjusted by changing the impedance of the resonant circuits connected to the hybrid couplers (1a and 1b). In the example shown in FIG. 1, the group delay time can be adjusted by changing the characteristic impedance of the resonators 2a, 3a, 2b, and 3b forming the resonant circuits.

Figure 5:
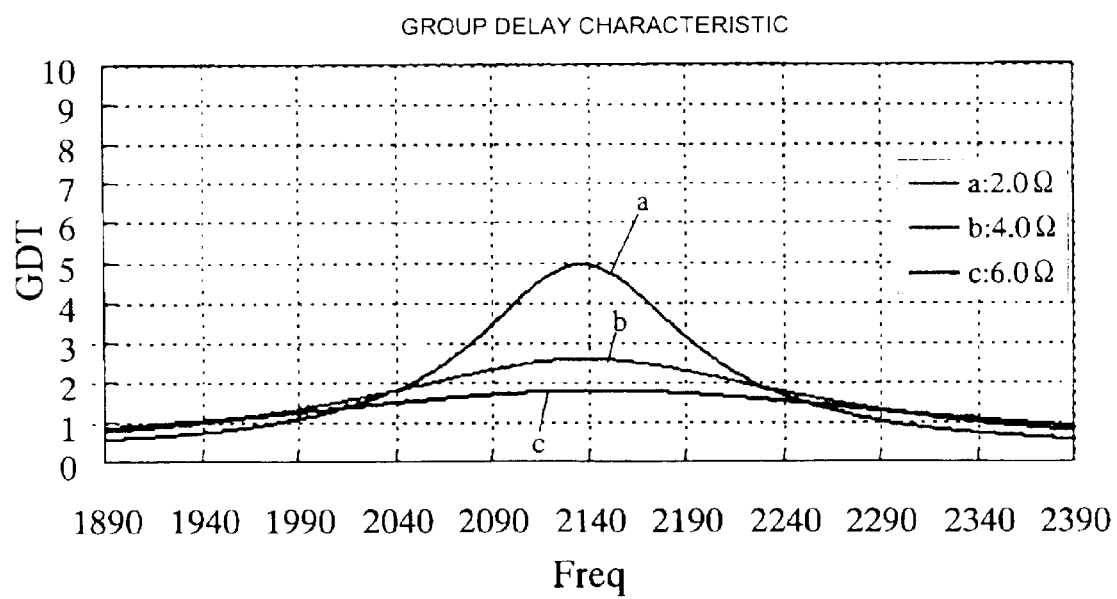
FIG. 5 is a graph showing the dependence of the group delay characteristic on the characteristic impedance of resonant circuits connected to the coupler.

The characteristic impedance of the dielectric coaxial resonators can be changed by changing the ratio of the outer diameter to the inner diameter of the dielectric coaxial resonators or by changing the dielectric constant. FIG. 5 shows an example of the dependence of the group delay characteristic on the characteristic impedance. In FIG. 5, curves a, b, and c indicate the group delay characteristic for characteristic impedance of 2.0, 4.0, and 6.0 Ω, respectively. As can be seen, the group delay increases with decreasing characteristic impedance.

Adjustment of group delay time in mass production can be performed by varying the peak frequency of the convex group delay circuits. More specifically, in the case in which two convex group delay circuits are connected in cascade as shown in FIG. 1, if the difference in peak frequency of the group delay time between the two convex group delay circuits 10a and 10b is increased, the overall time decreases. Conversely, if the difference between the two peak frequencies is reduced, the overall group delay increases. The peak frequencies of the convex group delay circuits 10a and 10b can be adjusted by changing the resonant frequencies of the resonators 2a, 3a, 2b, and 3b. For example, if the resonators 2a, 3a, 2b, and 3b are formed by $\lambda/4$ dielectric coaxial resonators, the resonant frequency can be increased by trimming the open plane and can be reduced by trimming the short-circuited plane.

Figure 6:
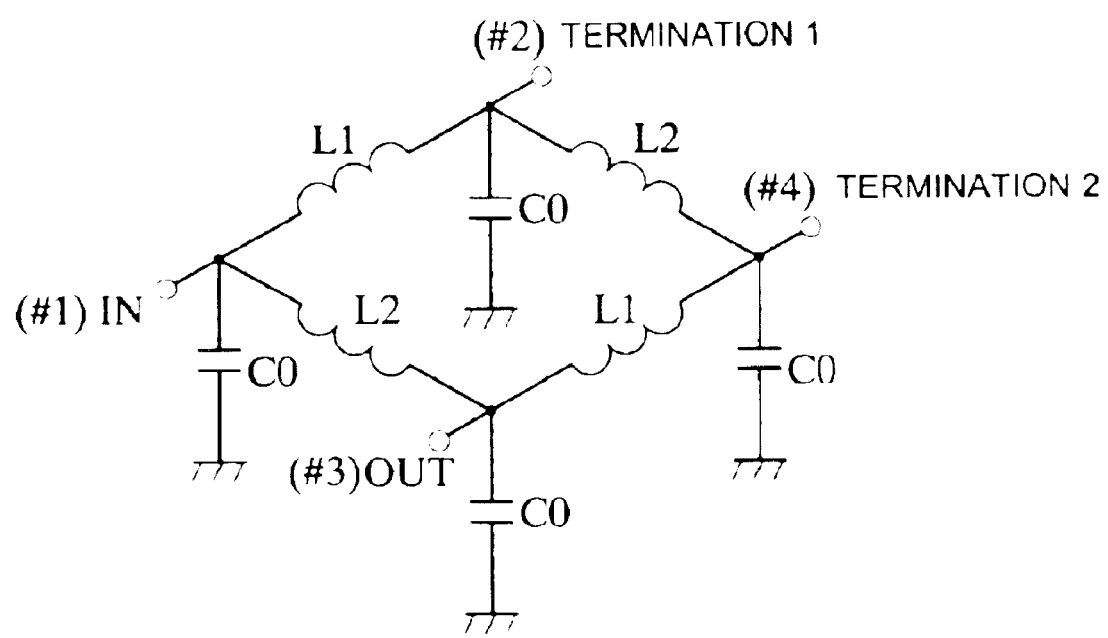
FIG. 6 is a diagram showing the structure of a coupler used in an in-band group delay equalizer according to a second embodiment of the present invention.

FIG. 6 shows an example of a hybrid coupler used in a group delay equalizer according to a second embodiment.

In the example shown in FIG. 6, the hybrid coupler is formed of a bridge circuit including inductors L1 and L2 and capacitors CO. Hybrid couplers using such a bridge circuit are employed, for example, as the couplers 1a and 1b shown in FIG. 1. That is, instead of the coupler having the structure shown in FIG. 3, a hybrid coupler using the bridge circuit may be employed. More specifically, two resonant circuits are connected to one such hybrid coupler using the bridge circuit thereby forming one convex group delay circuit. Two such convex group delay circuits are connected in cascade to form a group delay equalizer.

In FIG. 6, IN denotes an input terminal, and OUT denotes an output terminal. Circuit parameters are determined so that the phase difference between the input and output terminals becomes one quarter the wavelength at the operating frequency.

A signal applied to the input terminal IN travels to the output terminal OUT via two paths: IN→OUT, and IN→termination port 1→termination port 2→OUT. The phases of the two signals become opposite when they arrive at the output terminal OUT after traveling through the two paths. The circuit parameters are also determined so that the two signals propagating through those two paths become equal in amplitude, and thus so that no signal appears at the output terminal OUT.

On the other hand, the signal applied to the input terminal IN travels to the termination port 1 through two paths: IN→termination port 1; and IN→OUT→termination port 2→termination port 1. Also in this case, the two signals become opposite in phase when there arrive at the termination port 1. However, they become different in amplitude (because the circuit parameters are determined so that the amplitude becomes different), the signal applied to the input terminal IN appears at the termination port 1.

Similarly, the signal applied to input terminal IN travels to the termination port 2 through two paths: IN→termination port 1→termination port 2; and IN→to OUT→termination port 2. In this case, the two signals become equal in phase at the termination port 2, and thus the signal applied to the input terminal IN appears at the termination port 2.

Because the resonant circuit is connected to the termination port 1 (port #2), the signal output from the termination port 1 is terminated by that resonant circuit. The signal is then returned back from the resonant circuit, wherein the characteristic of the resonant circuit is reflected in this returned signal. The returned signal applied to the termination port 1 travels to the output terminal OUT through two paths: termination port 1→IN→OUT; and termination port 1→termination port 2→OUT. Those two signals become equal in phase at the output terminal OUT, and thus the signal applied to the termination port 1 appears at the output terminal OUT.

On the other hand, the signal output from the termination port 2 (port #4) is terminated by the resonant circuit connected to the termination port 2. The signal is then returned back from the resonant circuit to the termination port 2, wherein the characteristic of the resonant circuit is reflected in this returned signal. This signal applied to the termination port 2 travels to the output terminal OUT through two paths: termination port 2→OUT; and termination port 2→termination port 1→IN→OUT. Those two signals become opposite in phase at the output terminal OUT. However, the amplitudes thereof are not equal (because the circuit parameters are determined so that the amplitudes become different in this case), the signal applied to the termination port 2 appears at the output terminal OUT.

As described above, the signal applied to the input terminal IN appears at the output terminal OUT, wherein the characteristics of the two resonant circuits are reflected in the signal appearing at the output terminal OUT.

A group delay equalizer according to a third embodiment is described below with reference to FIGS. 7 to 9B.

Figure 7:
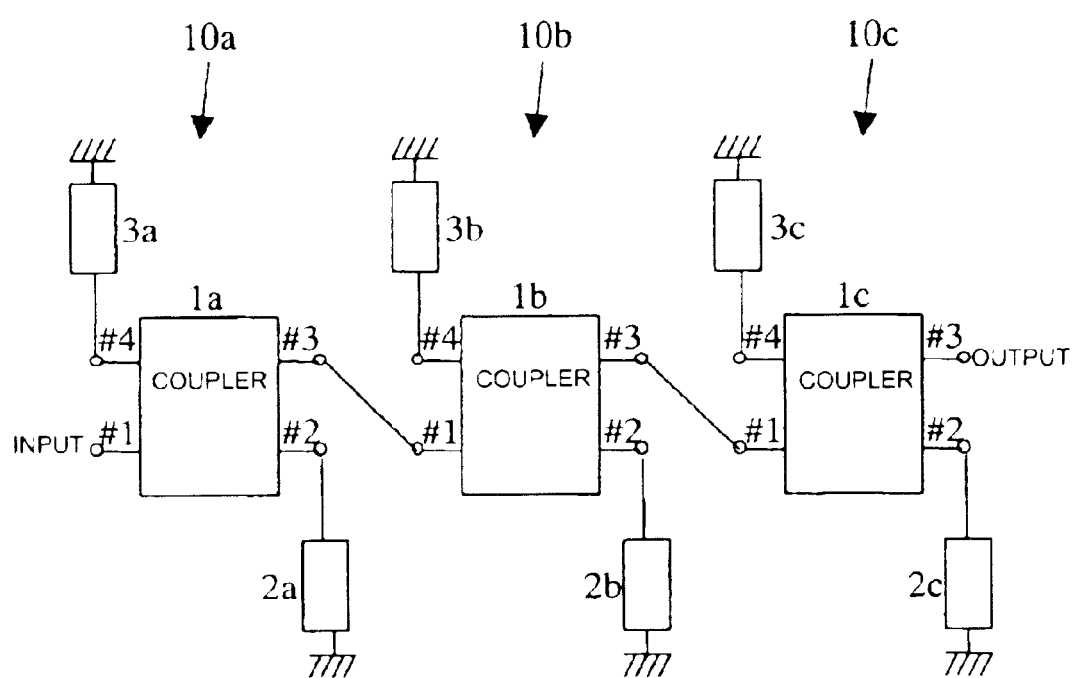
FIG. 7 is an equivalent circuit of an in-band group delay equalizer according to a third embodiment of the present invention.

FIG. 7 is a circuit diagram thereof. In the example described earlier with reference to FIG. 1, a two-stage convex group delay circuit is used. In contrast, in this example shown in FIG. 7, three convex group delay circuits 10a, 10b, and 10c are used. More specifically, a port #3 of a coupler 1a, serving as the output port of the convex group delay circuit 10a, is connected to a port #1 of a coupler 1b, serving as the input port of the convex group delay circuit 10b, and a port #3 of the coupler 1b, serving as the output port of the convex group delay circuit 10b, is connected to a port #1 of a coupler 1c, serving as the input port of the convex group delay circuit 10c. A port #1 of the coupler 1a is used as the input port of the convex group delay circuit 10a, and a port #3 of the coupler 1c is used as the output port of the convex group delay circuit 10c.

Thus, the three convex group delay circuits 10a, 10b, and 10c are connected in cascade.

Figure 8:
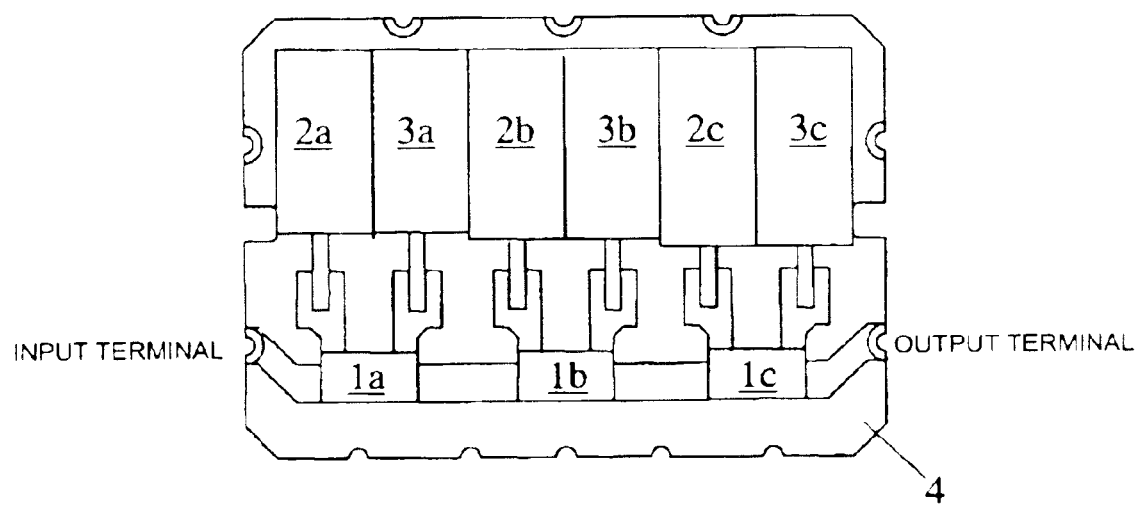
FIG. 8 is a diagram showing the structure of the in-band group delay equalizer according to the third embodiment of the present invention.

FIG. 8 shows the structure of the group delay equalizer. In this group delay equalizer, couplers 1a, 1b, and 1c and resonators 2a, 3a, 2b, 3b, 2c, and 3c are disposed in a substrate 4 in a similar manner to the group delay equalizer according to the first embodiment. That is, each of resonators 2a, 3a, 2b, 3b, 2c, and 3c is formed of a dielectric coaxial resonator, and the outer conductor of each dielectric coaxial resonator is connected to a ground electrode formed on the substrate 4, and the pin electrode is connected to an electrode pattern formed on the upper surface of the substrate 4. Furthermore, the couplers 1a, 1b, and 1c are disposed on the upper surface of the substrate 4 such that the couplers 1a, 1b, and 1c are connected to the electrode pattern formed on the substrate 4. In this structure, the four ports #1 to #4 of the coupler 1a are connected to the input terminal, the resonators 2a and 3a, and the input port of the coupler 1b, respectively, via the electrode pattern formed on the substrate 4. On the other hand, the four ports #1 to #4 of the coupler 1b are connected to the output port of the coupler 1a, the resonators 2b and 3b, and the input port of the coupler 1c, respectively, via the electrode pattern formed on the substrate 4. Furthermore, the four ports #1 to #4 of the coupler 1c are connected to the output port of the coupler 1b, the resonators 2c and 3c, and the output terminal, respectively, via the electrode pattern formed on the substrate 4.

Figure 9A:
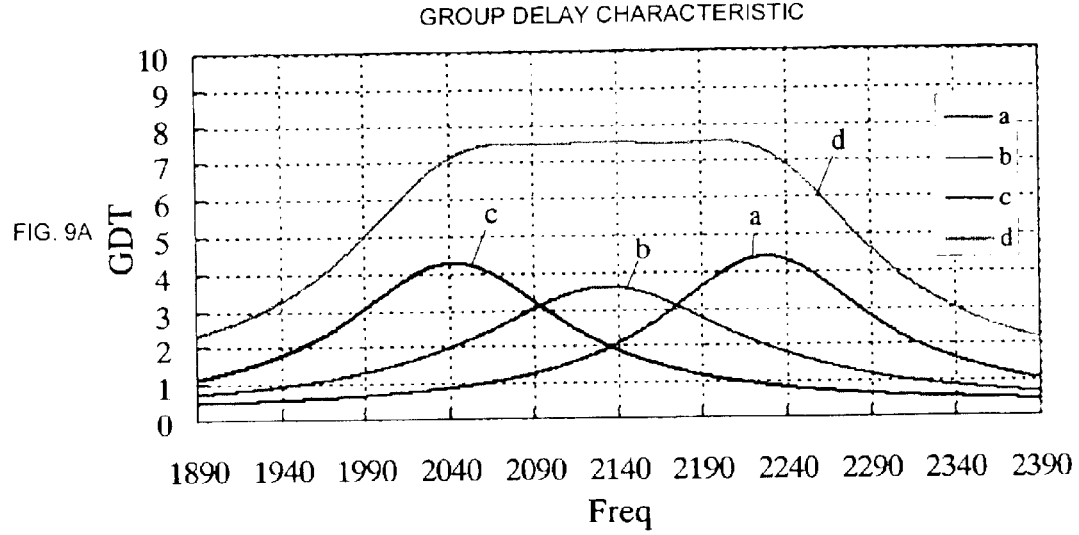
FIGS. 9A and 9B are graphs showing the group delay characteristic and the transfer characteristic of the in-band group delay equalizer according to the third embodiment of the present invention.
Figure 9B:
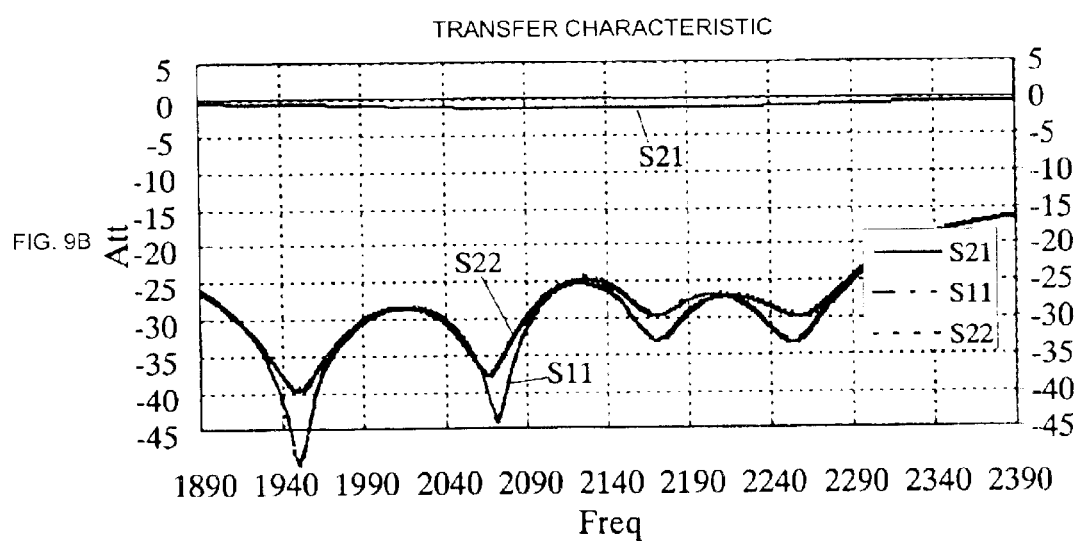

FIGS. 9A and 9B show the group delay characteristic and the transfer characteristic, respectively, of this group delay equalizer. In FIG. 9A, curve a indicates the group delay characteristic of the convex group delay circuit 10a, curve b indicates the group delay characteristic of the convex group delay circuit 10b, and curve c indicates the group delay characteristic of the convex group delay circuit 10c. Curve d indicates the overall group delay characteristic of the group delay equalizer, as a whole, formed of the three convex group delay circuits.

As can be seen, by increasing the number of convex group delay circuits, it is possible to increase the bandwidth in which the overall group delay of the group delay equalizer becomes flat. In the two-stage convex group delay circuit shown in FIG. 1, if the difference in center frequency (peak frequency) of the group delay characteristic is increased to a great degree, the overall group delay characteristic of the group delay equalizer has a drop near the center of the passband, which results in an increase in variation in group delay. To compensate for that, one or more convex group delay circuits are added depending on the required group delay variation and bandwidth. In this circuit configuration, the group delay time of a convex group delay circuit having a highest center frequency and the group delay time of a convex group delay circuit having a lowest center frequency are set to be greater than the group delay time of the other group delay circuits. In the example shown in FIG. 9A, the maximum group delay times of the convex group delay characteristics indicated by curves a and c are set to be greater than the maximum group delay time of the convex group delay characteristic indicated by curve b so that the overall group delay characteristic becomes as flat as possible over a wide frequency band.

As can be seen from FIG. 9B, a low insertion loss and low reflection can be achieved over a wide frequency band when the three-stage convex group delay circuit is used.

Now, a group delay equalizer according to a fourth embodiment is described below with reference to FIGS. 10 to 12.

Figure 10:
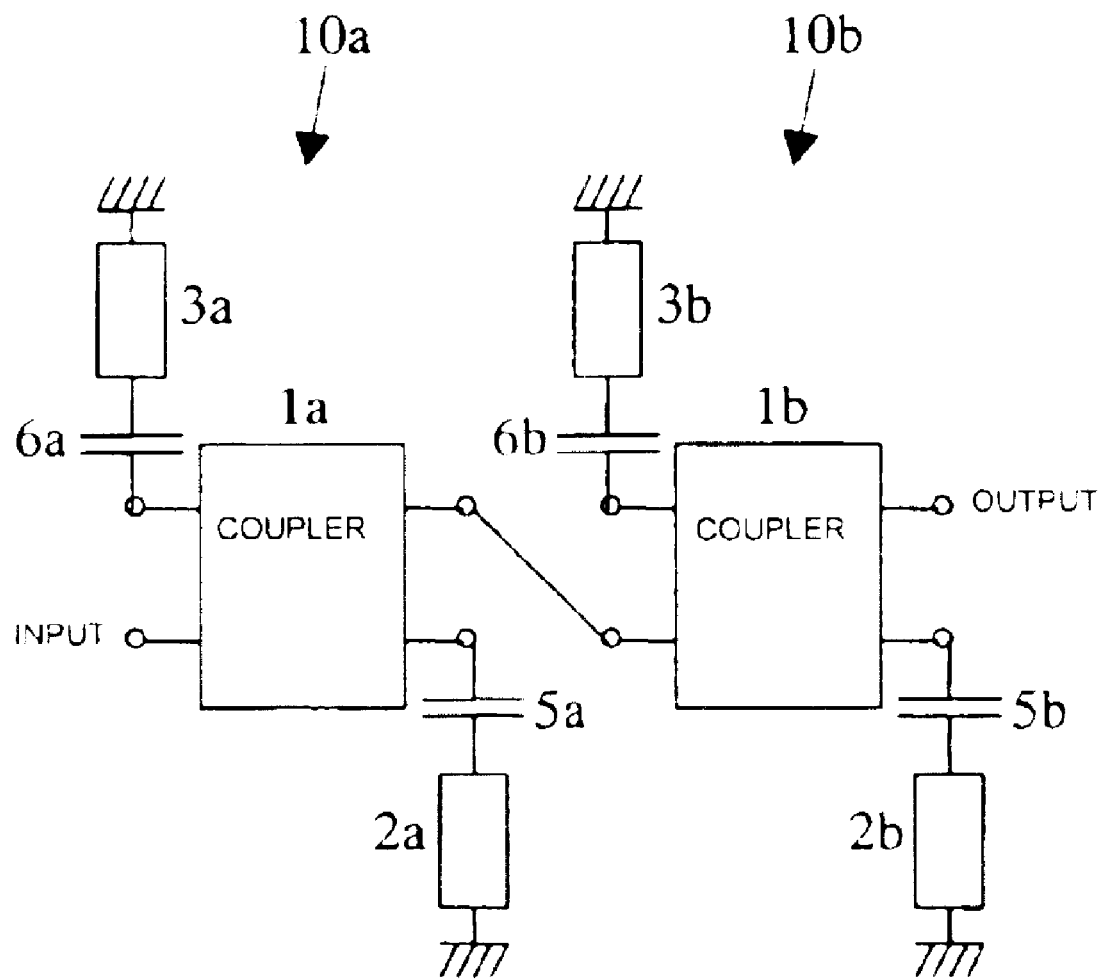
FIG. 10 is a diagram showing the structure of a coupler used in an in-band group delay equalizer according to a fourth embodiment of the present invention.

FIG. 10 is an equivalent circuit thereof. In this group delay equalizer, unlike the group delay equalizer according to the first embodiment described above with reference to FIG. 1, each of resonant circuits connected to respective couplers 1a and 1b is formed of a series connection of a resonator and a capacitor. More specifically, each resonant circuit is formed of a dielectric resonator 2a, 3a, 2b, or 3b and a capacitor 5a, 6a, 5b, or 6b.

Figure 11:
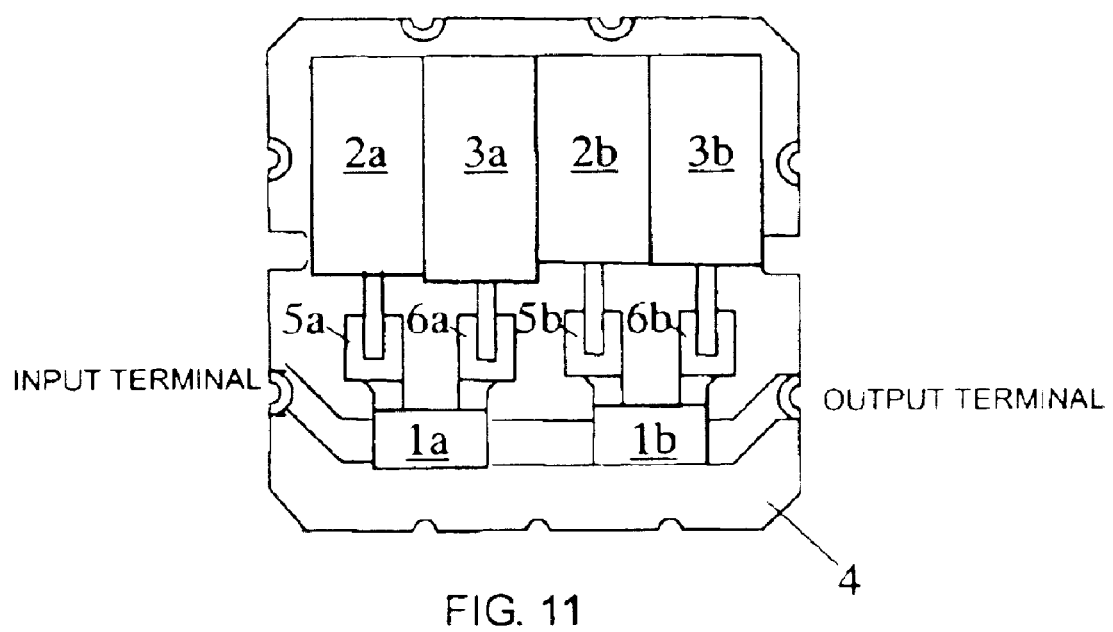
FIG. 11 is a diagram showing the structure of the in-band group delay equalizer according to the fourth embodiment of the present invention.

FIG. 11 shows the structure of this group delay equalizer. As shown in FIG. 11, the couplers 1a and 1b, the resonators 2a, 3a, 2b, and 3b in the form of dielectric coaxial resonators, and the capacitors 5a, 6a, 5b, and 6b are disposed on the upper surface of a substrate 4.

In the first embodiment, the group delay time is adjusted by the characteristic impedance of the respective dielectric resonators. However, the change in the characteristic impedance of the dielectric resonators can cause a reduction in Q value from the possible greatest value. The above problem can be avoided if the structure shown in FIG. 10 is employed and the group delay time is adjusted by changing the capacitance of the capacitors in the respective resonant circuits. That is, the group delay time can be adjusted while maintaining the maximum Q value for the resonators.

Figure 12:
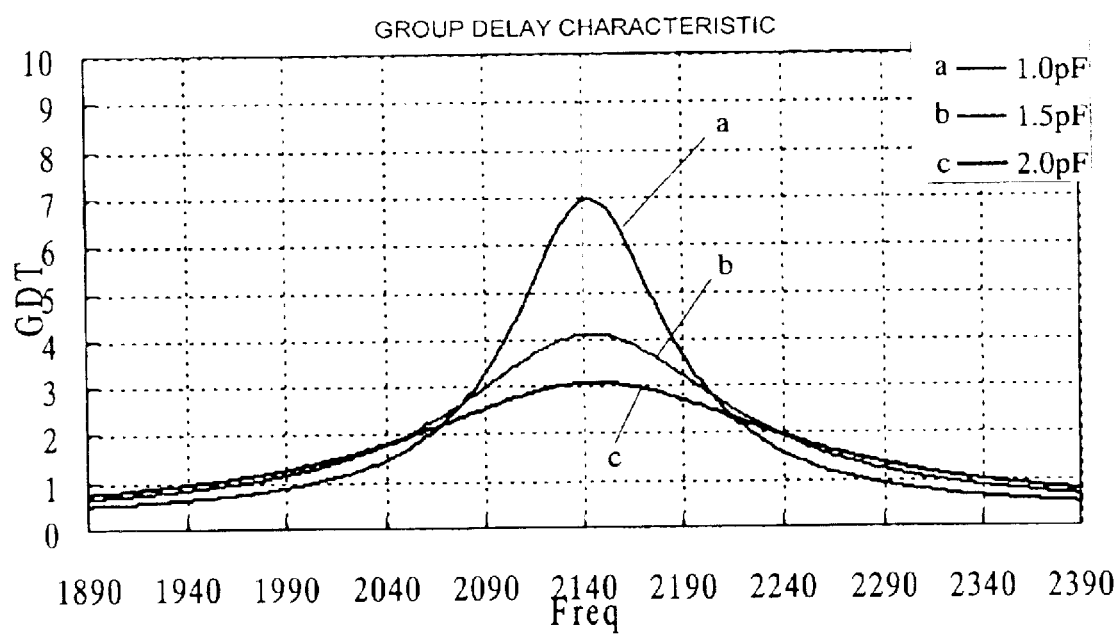
FIG. 12 is a graph showing the dependence of the group delay on the capacitance of capacitors included in resonant circuits.

FIG. 12 shows the dependence of the group delay characteristic of a one-stage convex group delay circuit on the capacitance of the capacitor described above. In FIG. 12, curves a, b, and c indicate the group delay characteristic for capacitance of 1.0 pF, 1.5 pF, and 2.0 pF, respectively.

As can be seen, the maximum delay time of the group delay characteristic increases with decreasing capacitance of the above-described capacitor. In this example, the resonance length of the dielectric resonators is adjusted so that the respective resonant circuits equally have a resonant frequency of 2140 MHz.

Similar effects can also be obtained when the capacitors in the respective resonant circuits are replaced with inductors. In this case, the maximum delay time of the group delay characteristic can be adjusted by adjusting the inductance of the inductors disposed between the respective resonators and the corresponding couplers. More specifically, the maximum delay time decreases with decreasing inductance. As described above, in this fourth embodiment, each resonant circuit is formed of a resonator and a reactance element connected in series thereto, and the maximum group delay is adjusted by adjusting the reactance.

In the first to fourth embodiments described above, dielectric coaxial resonators are used. In general, dielectric coaxial resonators have high unloaded Q (Qo), and thus a group delay equalizer having a very low insertion loss can be realized, as indicated for example, by S21 in FIG. 9B.

Instead of dielectric resonators such as those described above, another type of resonator such as an LC resonator or a SAW (Surface Acoustic Wave) resonator may be used.

A distortion compensation amplifier according to a fifth embodiment is described below with reference with FIG. 13.

Figure 13:
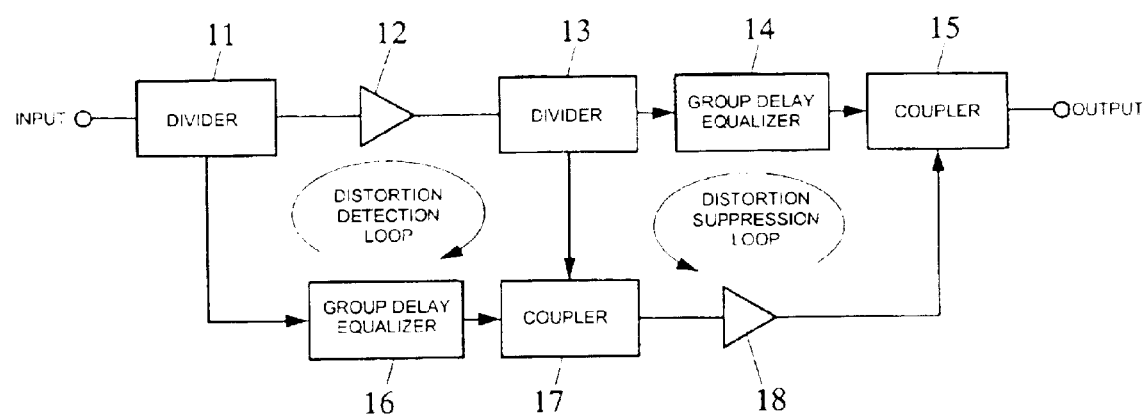
FIG. 13 is a circuit diagram of a distortion compensation amplifier according to a fifth embodiment of the present invention.
Figure 14:
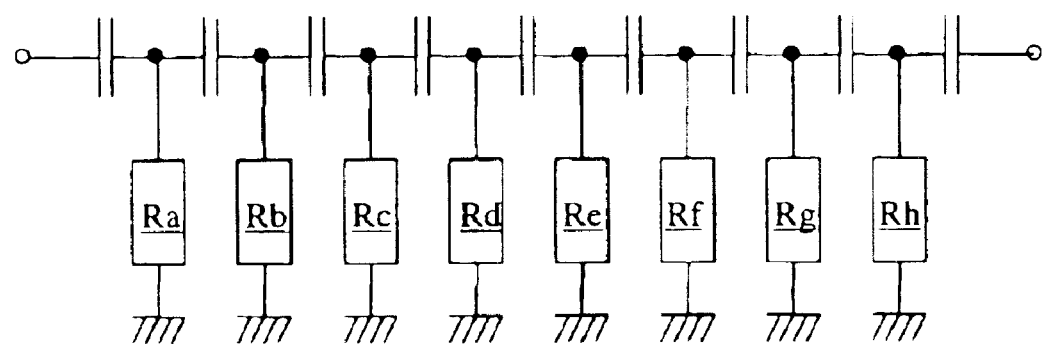
FIG. 14 is an equivalent circuit of a group delay circuit using a bandpass filter according to a conventional technique.
Figure 15:
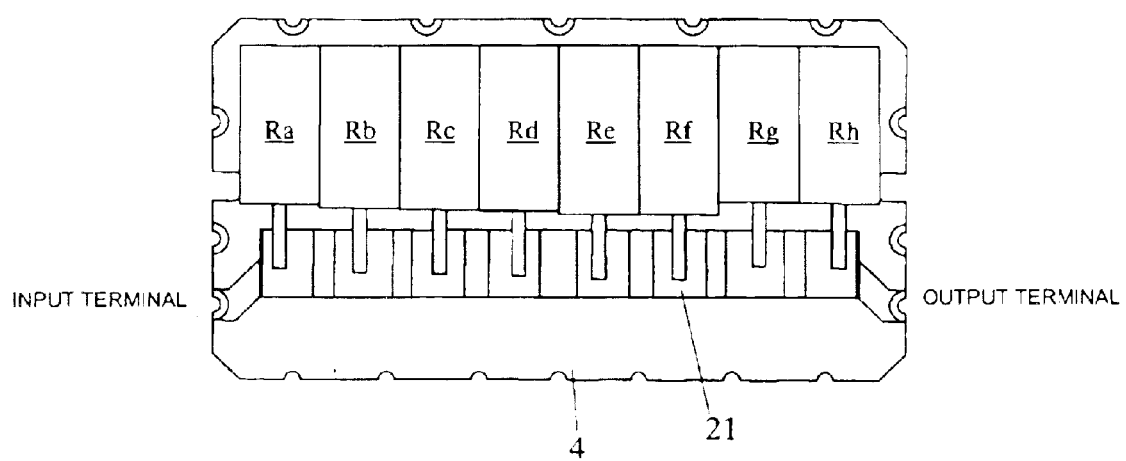
FIG. 15 is a diagram showing the structure of the group delay circuit according to the conventional technique.
Figure 16A:
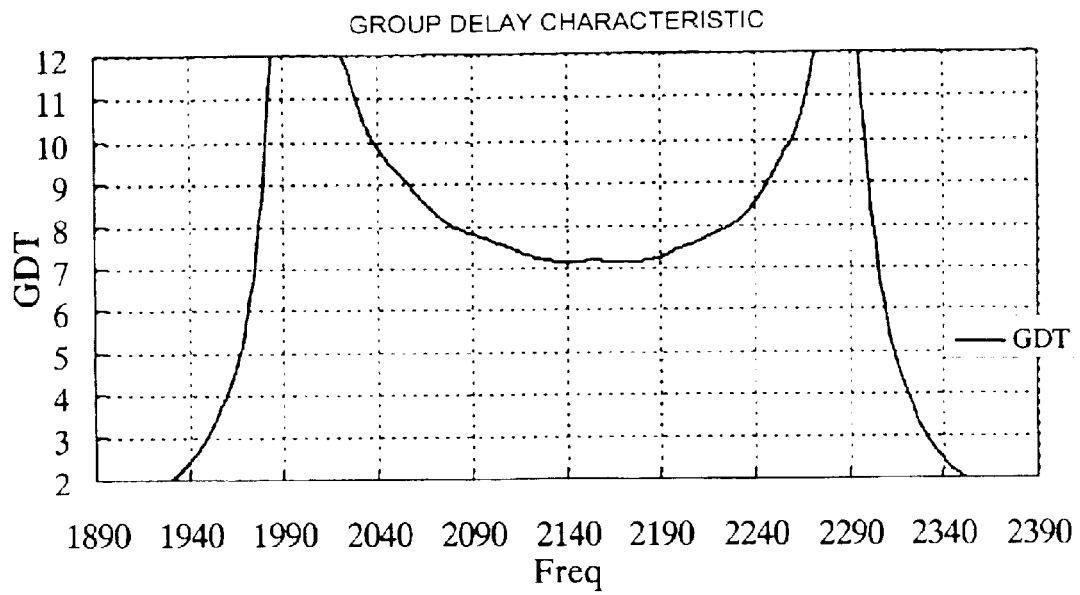
FIGS. 16A and 16B are graphs showing examples of the group delay characteristic and the transfer characteristic of the in-band group delay equalizer according to the conventional technique.
Figure 16B:
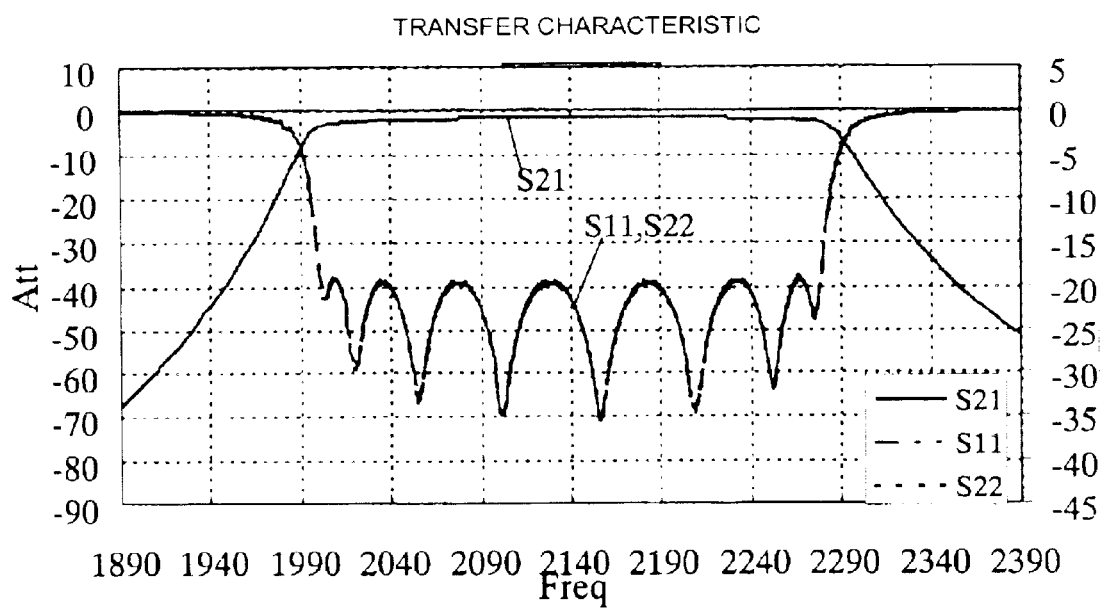
Figure 17:
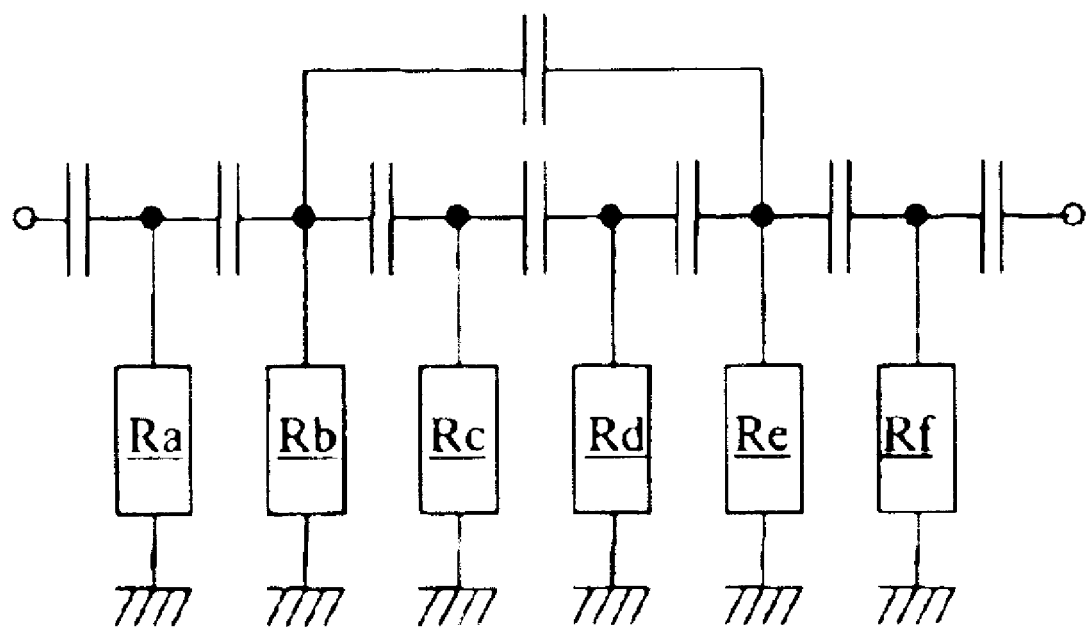
FIG. 17 is an equivalent circuit of another group delay circuit using a bandpass filter according to a conventional technique.
Figure 18:
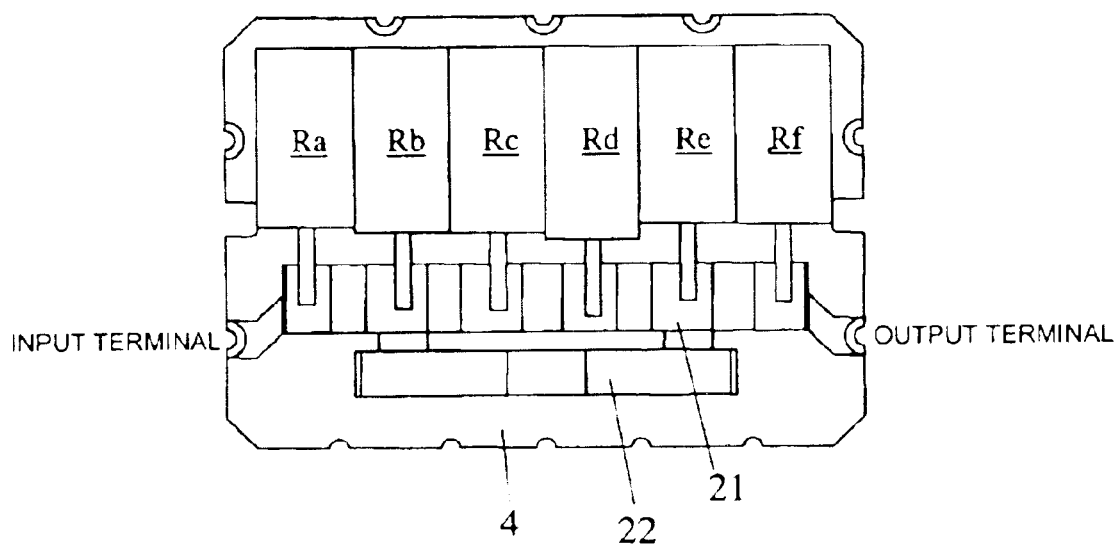
FIG. 18 is a diagram showing the structure of the in-band group delay equalizer according to the conventional technique.
Figure 19A:
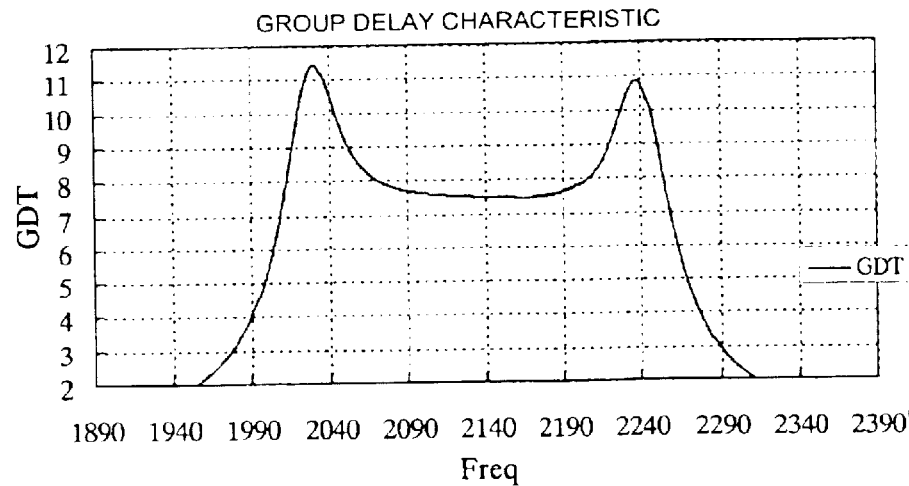
FIGS. 19A and 19B are graphs showing the group delay characteristic and the transfer characteristic of the in-band group delay equalizer according to the conventional technique.
Figure 19B:
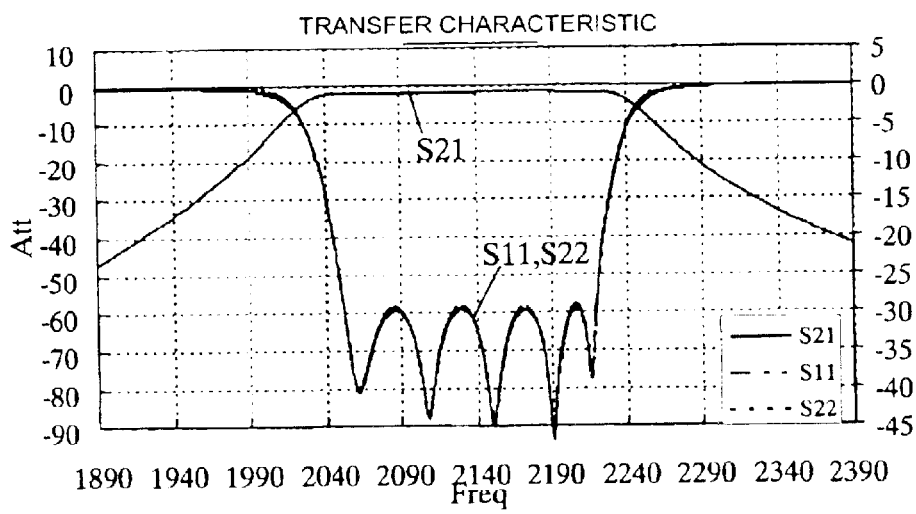
Figure 20A:
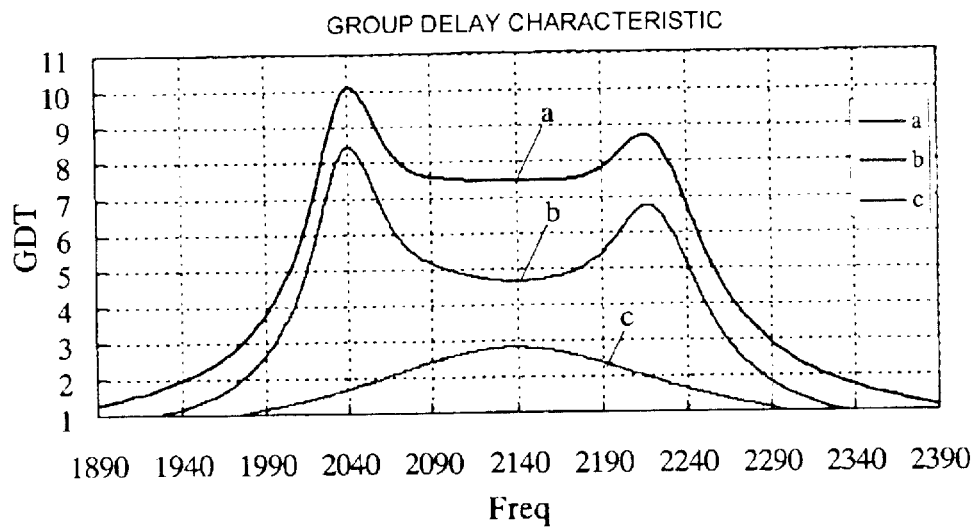
FIGS. 20A and 20B are graphs showing the group delay characteristic and the transfer character of a conventional group delay circuit formed of a combination of a bandpass filter and a convex group delay circuit.
Figure 20B:
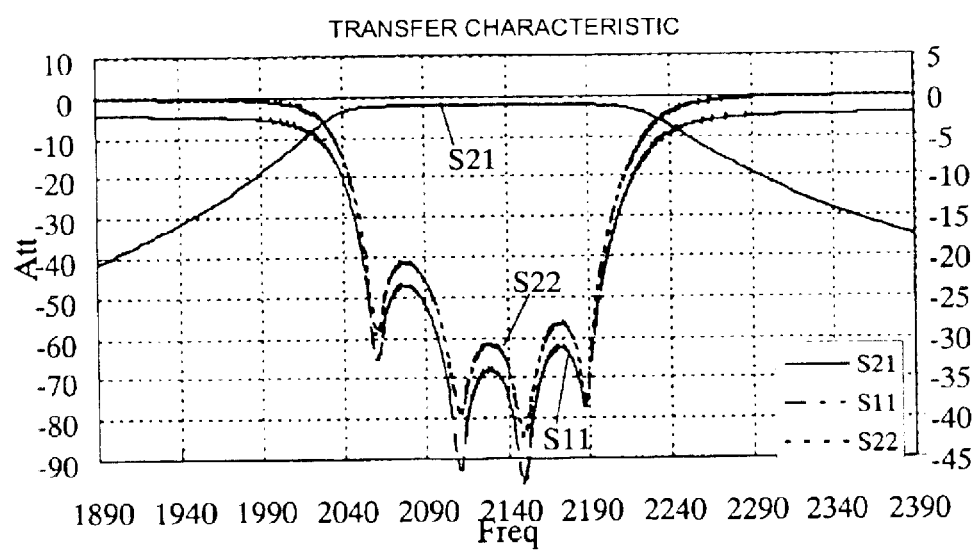

FIG. 13 is a block diagram of the distortion compensation amplifier formed of a feedforward amplifier. In the distortion compensation amplifier shown in FIG. 13, an input signal is divided by a divider 11. An amplifier 12 amplifies a signal received from the divider 11 and outputs the resultant amplified signal to a divider 13. A group delay equalizer 16 produces a delay in the signal received from the divider 11 and supplies the resultant signal to a coupler 17. The divider 13 divides the signal output from the amplifier 12. The coupler 17 combines the signal received from the divider 13 and the signal received from the group delay equalizer 16 and outputs the resultant signal to an amplifier 18. The amplifier 18 amplifies the received signal and supplies the resultant amplified signal to a coupler 15. The group delay equalizer 14 produces a delay in the signal received from the divider 13 and supplies the resultant delayed signal to the coupler 15. The coupler 15 combines the signal received from the group delay equalizer 14 and the signal received from the amplifier 18.

The divider 11, the amplifier 12, the divider 13, the coupler 17, and the group delay equalizer 16 form a distortion detection loop. The signal produced by the coupler 17 by combining the signal applied from the divider 13 to the coupler 17 and the signal applied from the group delay equalizer 16 to the coupler 17 indicates a distortion component generated by the amplifier 12. The divider 13, the group delay equalizer 14, the coupler 15, the coupler 17, and the amplifier 18 forms a distortion suppression loop. In this distortion suppression loop, the detected distortion component output from the coupler 17 is amplified by the amplifier 18 and the resultant amplified signal is applied, as a distortion suppression signal, to the coupler 15. As a result, the non-linear distortion component generated by the amplifier 12 is cancelled. The delay time of the group Y delay equalizer 16 is set so that the signal applied to the coupler 17 after passing though the path including the amplifier 12 and the signal applied to the coupler 17 after passing through the path including the group delay equalizer 16 have the same delay time. On the other hand, the delay time of the group delay equalizer 14 is set so that the two signals applied to the coupler 15 become opposite in phase thereby canceling the distortion.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An in-band group delay equalizer for receiving an input signal, the equalizer comprising three or more convex group delay circuits, each having convex group delay characteristic in which a delay time decreases with deviation of frequency from a center frequency, wherein the center frequency of each convex group delay circuit is different from each others, the convex group delay circuits are connected in cascade, and the group delay time of a first convex group delay circuit having a highest center frequency of the three or more convex group delay circuits and the group delay time of a second convex group delay circuit having a lowest center frequency of the three or more convex group delay circuits are greater than the group delay time of the other convex group delay circuits of the three or more convex group delay circuits.

2. An in-band group delay equalizer according to claim 1, wherein each convex group delay circuit includes a hybrid coupler and a resonant circuit connected to a divided output port of the hybrid coupler.

3. An in-band group delay equalizer according to claim 2, wherein the resonant circuit is formed of a dielectric coaxial resonator.

4. An in-band group delay equalizer according to claim 2, wherein the resonant circuit is formed of a series connection of a dielectric coaxial resonator and a reactance element.

5. A distortion compensation amplifier comprising a group delay circuit, wherein the group delay circuit is formed of the in-band group delay equalizer according to claim 1.

6. A distortion compensation amplifier constructed in the form of a feedforward amplifier, the feedforward amplifier including a distortion detection loop and a distortion suppression loop, each of the distortion detection loop and the distortion suppression loop including a group delay circuit, wherein the group delay circuit is formed of the in-band group delay equalizer according to claim 1.

* * * * *